United States Patent [19]
Cerda

[11] Patent Number: 5,095,277
[45] Date of Patent: Mar. 10, 1992

[54] SYSTEM TO TEST WIRING PARTS

[75] Inventor: Léon G. Cerda, Carry-le-Rouet, France

[73] Assignee: Aerospatiale Societe Nationale Industrielle, Paris, France

[21] Appl. No.: 468,930

[22] Filed: Jan. 23, 1990

[30] Foreign Application Priority Data

Feb. 13, 1989 [FR] France ............... 89 01826

[51] Int. Cl.$^5$ ........................... H04B 3/46
[52] U.S. Cl. ........................... 324/539; 324/66
[58] Field of Search ........... 324/66, 536, 539; 364/459

[56] References Cited

U.S. PATENT DOCUMENTS

| | | |
|---|---|---|
| 2,488,556 | 11/1949 | Paramenter . |
| 4,584,766 | 4/1986 | Ogawa et al. ............ 324/66 |
| 4,620,282 | 10/1986 | Shelley . |
| 4,698,585 | 10/1987 | Herman et al. .......... 324/66 |
| 4,859,953 | 8/1989 | Young et al. ............ 324/539 |
| 4,916,444 | 4/1990 | King ....................... 324/66 |

OTHER PUBLICATIONS

Fry, IBM Tech. DIsclosure Bull., vol. 27, No. 4A, (Sep. 1984), p. 2245.
Casa, IBM Tech. Disclosure Bull., vol. 26, No. 7A, (Dec. 1983), pp. 318 to 320.

Primary Examiner—Kenneth A. Wieder
Assistant Examiner—Maura K. Regan
Attorney, Agent, or Firm—Fisher, Christen & Sabol

[57] ABSTRACT

The present invention concerns a system to test wiring parts, said system comprising a test bench having connection means for said wiring parts, each of said parts comprising connectors.

According to the invention, said connection means (1) comprise a plurality of identical connection locations (3) and the system further includes intermediate connection devices (5) between the test bench (4) and the wiring part to be tested, each of said intermediate connection devices comprising a first connector (6) complementary to the corresponding connector of the wiring part to be tested and a second connector (7) designed to be connected to certain of said connection locations (3) whose position is specific as regards the wiring part to be tested, said first (6) and second (7) connectors being connected to each other by a flexible linking cable (8).

10 Claims, 4 Drawing Sheets

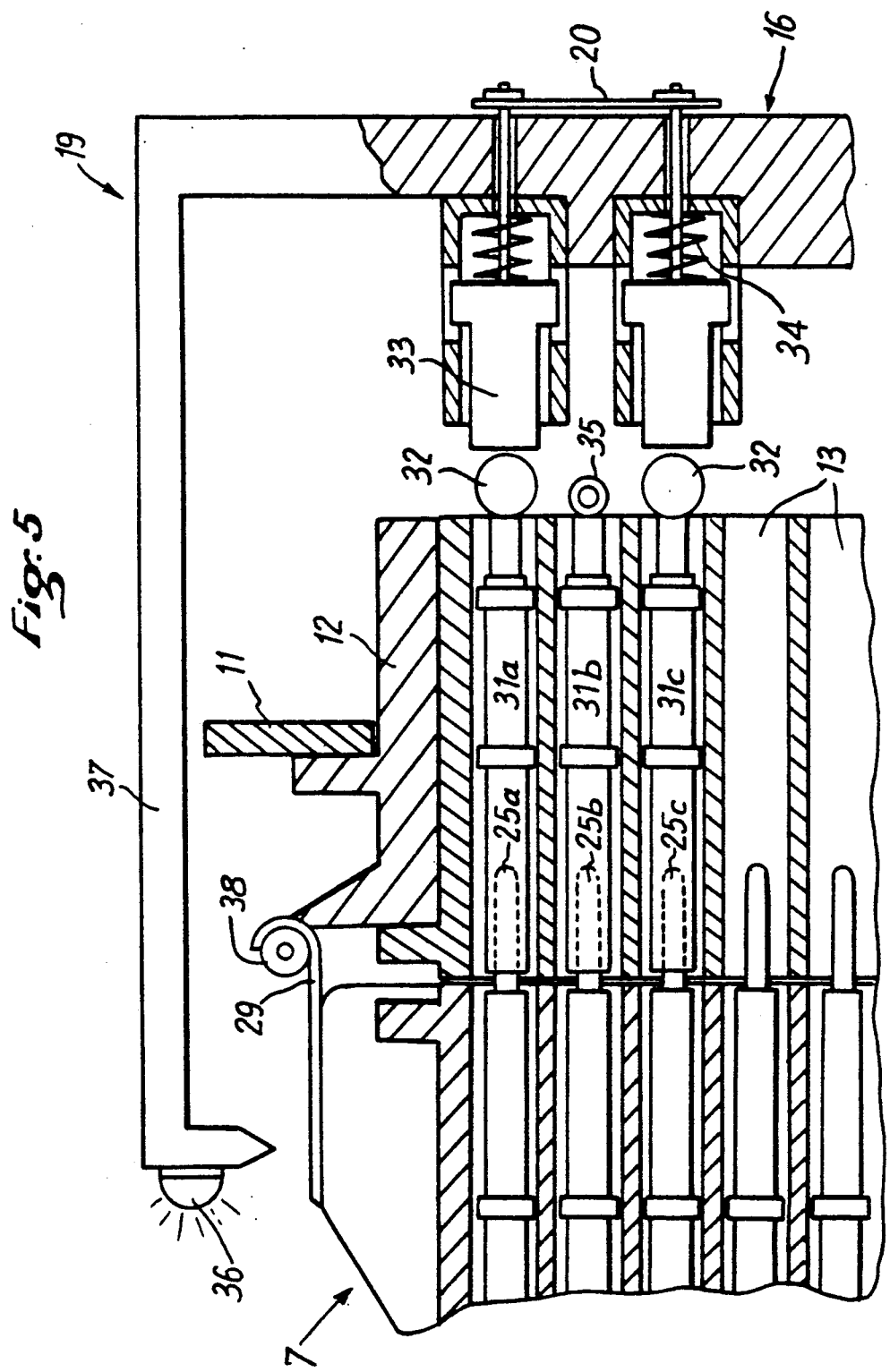

5,095,277

SYSTEM TO TEST WIRING PARTS

FIELD OF THE INVENTION

The present invention concerns a system to test wiring parts. The term "wiring part" is understood to denote a bundle of electric wires or cables making it possible to transmit the information and commands required to operate a complex machine, such as an aircraft.

BACKGROUND OF THE INVENTION

So as to verify the electric continuity and insulation of the links and connections of the wiring part, after said part has been completed in the workshop and prior to its assembly, for example aboard an aircraft such as a helicopter, a specialized test bench is used to connect in a known way all the links and connections of said wiring part. To this effect, the test bench thus needs to include all the connectors complementary to those of the various wiring parts to be tested. Such a disposition for the linking of wiring parts on the test bench is unsatisfactory to the extent that, in particular as regards aeronautical applications and depending on the type of aircraft and the usages demanded of said aircraft, a large number of different wiring parts to be tested are required. Accordingly, it is essential to provide on the test bench a large number of additional connectors corresponding to those of the wiring parts to be tested, this requiring the test bench to cope with dimensions rendering it difficult, if not impossible, to connect such and such a connector from a wiring part to its additional connector at the correct location on the test bench. Furthermore, having regard to the multiplicity of said additional connectors present on the test bench, the risk of errors occuring is considerable.

SUMMARY OF THE INVENTION

The object of the present invention is to overcome these drawbacks and concerns a system to test wiring parts, said system being extremely flexible as regards usage and being extremely reliable.

To this effect, the system to test wiring parts is a system of the type comprising a test bench having connection means for said wiring parts each comprising connectors, said system of the invention being notable in that said connection means comprise a plurality of identical connection locations and in that the system further includes intermediate connection devices between the test bench and the wiring part to be tested, each of said intermediate connection devices comprising a first connector complementary to the corresponding connector of the wiring part to be tested and a second connector designed to be connected to certain of said connection locations whose position is specific as regards the wiring part to be tested, said first and second connectors being connected to each other by a flexible linking cable.

Thus, according to the invention, the test bench no longer merely includes a plurality of identical connection locations, some of which, as regards each particular wiring part to be tested, are used for the connection of said part which is not connected directly to said bench, as was the case up until now, but by means of specific connection devices connected firstly to said part and secondly to said test bench making in particular it possible to be freed of the localization problems indicated above relating to the connection of each connector of said part to the corresponding additional connector of said bench by virtue of the "extension piece" function carried out by each intermediate connection device.

Advantageously, said connection locations are provided on at least one independent support of the actual test bench and connected to the latter.

Preferably, said connection locations form modules, each comprising several of said locations.

In particular, said modules may be aligned adjacent to one another.

According to another characteristic of the invention, the system further includes:

means for storing a plurality of intermediate connection devices, each provided with identification means, and suitable control means, firstly for a particular wiring part so as to deduce the intermediate connection devices required to connect said wiring part to said test bench and to their specific connection modules, and secondly so as to control means designed to search for each of said intermediate connection devices for said particular wiring part in said storage means by means of the identification means of said control means and to indicate said intermediate connection device.

By means of these characteristics, the search in the storage means of the various intermediate connection devices for a particular wiring part may be automated, thus facilitating the task of the operator.

Advantageously, said control means are suitably adapted to control means making it possible to designate the specific connection module(s) of each of said intermediate connection devices on the test bench. The operator can therefore correctly connect the intermediate connection device to the test bench.

According to a further characteristic of the invention, said storage means comprises at least one support for a plurality of connection modules of the intermediate connection devices, said modules being aligned adjacent to one another.

Preferably, said search and indication means of a particular intermediate connection device are mounted on a carriage able to move along said support.

In particular, said carriage may be disposed on an endless strip driven by a step motor.

According to a further characteristic of the invention, the means for identifying the connection devices are on each occasion constituted by a pair of resistors with specific values and mounted in the second connector of each of said connection devices, and the means for searching and indicating the intermediate connection devices comprise means for measuring the values of the resistors of said pairs.

According to a further characteristic of the invention, the means to designate the specific connection module(s) of a particular intermediate connection device on the test bench also include a laser beam generator.

BRIEF DESCRIPTION OF THE DRAWINGS

The figures of the annexed drawing shall clearly reveal how the invention may be embodied. Identical references on these figures denote similar elements.

FIG. 5 is a transverse cutaway view of the search and indication means of a particular intermediate connection device in the storage means.

DETAILED DESCRIPTION OF THE PREFERRED EMBODIMENTS

Figure 1:
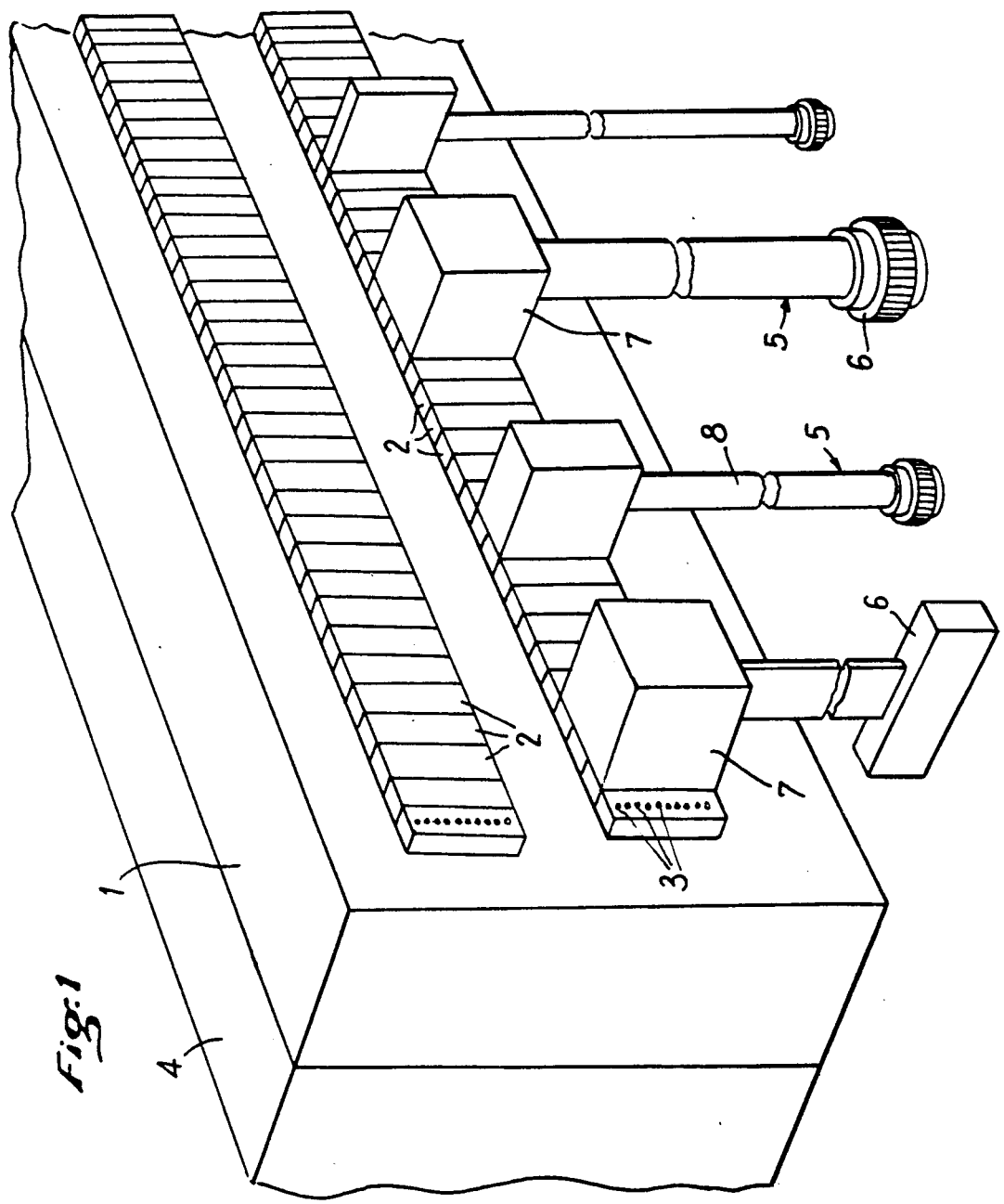
FIG. 1 is a perspective diagrammatic view of a support with a plurality of identical connection modules, said support being mounted on a test bench.

FIG. 1 diagrammatically represents a support 1 for a plurality of modules 2, each comprising several identical connection locations 3, the support 1 being mounted on the actual test bench 4. (In the example shown, the modules 2 are disposed in two series with one above the other and being aligned adjacent to each other in each series and it shall moreover be observed that the connection locations 3 have not on each occasion been shown for reasons of clarity of the drawing). A further possibility (not shown) would consist of connecting the test bench and the support, then being located at two separate positions, with the aid of an intermediate connecting gear. The actual test bench is of a conventional type and shall not be described here in more detail. Its purpose is simply to make it possible to verify the electric continuity of each conductor and the insulation of each link and connection of the wiring part (not shown). So as to connect the wiring part to the support 1 and thus to the test bench 4, the invention provides for the use of intermediate connection devices 5, the number and type of the devices being specific to a particular wiring part to be tested. To this effect, each intermediate connection device 5 includes a first connector 6 complementary to the corresponding connector of the wiring part to be tested, and a second connector 7, connected to the first connector by a flexible linking cable 8 and designed to be connected to certain modules and also being specific to the wiring part to be tested. A different number of modules is moreover required for the connection of any one of the intermediate connection devices (for example from 1 to 4 modules, as shown on FIG. 1).

Figure 3:
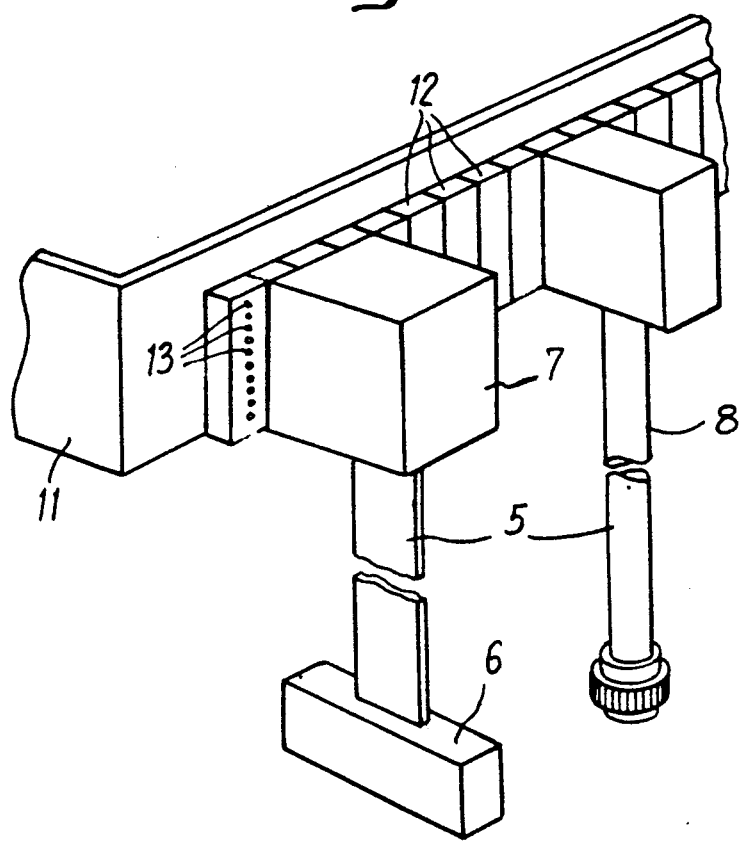
FIG. 3 is a diagrammatic partial perspective view showing the front face of a support belonging to the storage means for FIG. 2 with a plurality of connection modules.

Considering the large number of intermediate connection devices required for the various wiring parts to be tested, a further characteristic of the invention provides that, with each intermediate connection device 5 being supplied with identification means described later in detail, the system of the invention further includes storage means 10 with a plurality of intermediate connection devices 5 generally appearing in a shape similar to the support 1 described above, that is comprising a support 11 for a plurality of modules 12 for the connection of the intermediate connection devices 5, said modules being aligned on said support adjacent to each other and each having a certain number of connection locations 13 (FIG. 3).

Figure 2:
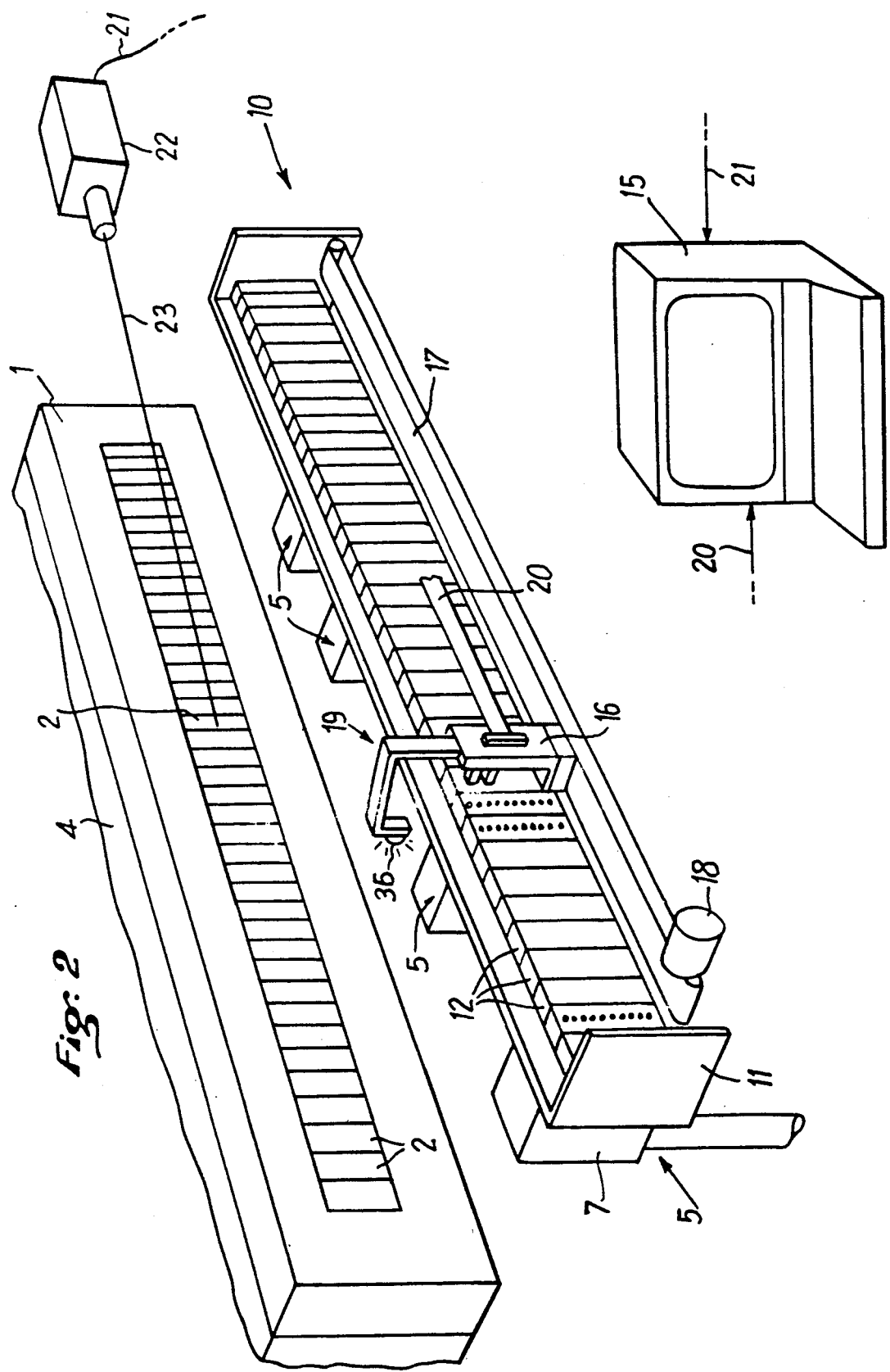
FIG. 2 diagrammatically shows a perspective view of the entire system for testing wiring parts according to the invention with, in particular, the means for storing the intermediate connection devices.

In addition, once the wiring part to be tested has been identified (for example, by the introduction of a code with the aid of the computer keyboard, reading of a bar code, etc), a microcomputer 15 (FIG. 2) is used to control the search for particular intermediate connection devices, required to connect said part to the test bench, in the storage means 10. In order to do this, a carriage 16 is provided and is able to move over the upper side of an endless strip 17 driven by a step motor 18 along the support 11 and behind the latter (it being understood that the intermediate connection devices are connected onto the front face of the support), search and indication means 19, to be described later in detail, of a particular intermediate connection device being mounted on said carriage and being connected to the microcomputer 15 via the linkage 20.

In addition, the microcomputer 15 is connected by the linkage 21 to a laser generator 22 whose beam is controlled to designate on the suppport 1 mounted on the test bench 4 the specific connection module(s) 2 of the intermediate connection device marked in the storage means 10.

Figure 4:
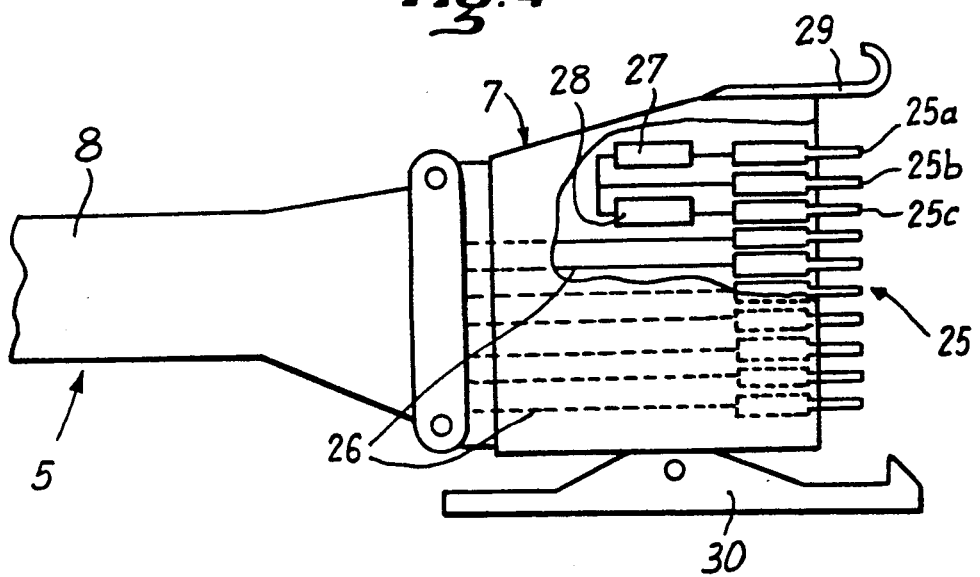
FIG. 4 is a front view with partial toothing of a second connector of an intermediate connection device.

FIG. 4 shows the second connector 7 of an intermediate connection device 5 comprising a certain number of plugs 25 connected to the first connector 6 (not shown on FIG. 4) by means of respective linkages 26, except the first three of these 25a, 25b, 25c. As shown on the figure, these allow for the mounting of a pair of resistors 27, 28 with specific values for each particular intermediate connection device so as to identify said connection device. These electrical resistors may be selected from a range of values of between 100 Ohms and 91,000 Ohms, namely 72 values. The grouping by two of these resistors makes it possible to obtain $72 \times 72 = 5184$ combinations. A combination of resistors—and only one single combination—is associated with a particular intermediate connection device.

The connector 7 moreover possesses hooks 29, 30 for fastening to a connection module.

With reference now to FIG. 5, the latter partially shows a connector 7 connected to one module 12 of the storage means 10. In particular, the plugs 25a, 25b and 25c are connected to the corresponding terminals 31a, 31b and 31c of the module 12. At their extremity opposite the one intended for connection of the corresponding plug 25a, 25c, the terminals 31a and 31c are each provided with a spherical contact 32 projecting from the module 12 and able to come into contact with the contact of a corresponding block 33 stressed by a compression spring 34 mounted on the carriage 16 and connected to the linkage 20. The terminals 31b of the modules 12 and each provided with a parallel recovery eye 35 are all connected in parallel. In addition, an indicator lamp 36 makes it possible to indicate the position of the sought-after intermediate connection device, said lamp being mounted at the extremity of an arm 37 integral with the carriage 16 and extending towards the front face of the support 11 of the modules 12. Moreover and as shown on the figure, the fastening hook 29 of the connector 7 can cooperate with a corresponding member 38 of the module 12 so as to keep the connection device 5 in position on the latter.

For a particular wiring part to be tested, the operator first of all enters the code of said part into the microcomputer 15, namely into the memory which stores the information relating to the intermediate connection devices required to connect said wiring part to the test bench. The movement of the carriage 16 along the support 11 of the modules 12 is then controlled so as to search for a first intermediate connection device 5 in the storage means 10, this device being identified by the specific values of the pair of resistors allocated, as regards the identification means, to each particular intermediate connection device. In this respect, it shall be observed that this search makes it possible to have the intermediate connection devices in any order whatsoever on the storage means.

With the required intermediate connection device having been marked by the measurement of the values of its pair of resistors, the indicators lamp 36 lights up informing the operator of the exact location of the marked intermediate connection device on the support 11. At the same time and still by means of the microcomputer 15, the laser generator 22 is controlled so that the laser beam 23 designates, on the support 1 of the modules 2 and mounted on the test bench 4, the position of the module(s) 2 to which the marked intermediate connection device needs to be connected. It then merely requires for the operator to remove said intermediate connection device from the support 11 and to place it in the designated position on the support 1. The same set of operations shall be restarted for all the other required intermediate connection devices. A measurement of the resistors on the module support connected to the test bench makes it possible to verify the presence and correct positioning of all the intermediate connection devices required for linkage with the particular wiring part to be tested. Said wiring part may then be connected to the test bench, each of the connectors of said part being connected to the corresponding additional connector of the intermediate connection devices, the test procedure then being implemented.

Thus, by means of the invention, it is relatively a simple matter to correctly place the various wiring parts on the test bench.

What is claimed is:

1. System for testing cables, each test cable having at least one cable connector, said system comprising:
   (a) a test bench having cable connection means for connection to said test cables, said cable connection means comprising a plurality of identical connection locations;
   (b) a plurality of intermediate connection devices disposed between the test bench and the test cable, each of said intermediate connection devices including a first connector complementary to the cable connector of the test cable, and a second connector complementary to at least one of said connection locations and positioned with respect to the test cable, said first and second connectors being interconnected by a flexible linkage cable;
   (c) storage means for supporting said plurality of intermediate connection devices, each intermediate connection device being provided with identification means; and
   (d) control means to deduce an intermediate connection device required to connect a test cable to a connection location on said test bench and search means to search for and identify a complementary intermediate connection device for said test cable in said storage means by said identification means and to indicate said complementary intermediate connection device.

2. System according to claim 1, wherein said connection locations are provided on at least one support independent of the test bench and connected to the test bench.

3. System according to claim 1, wherein said connection locations form modules each comprising several of said locations.

4. System according to claim 3, wherein said modules are aligned adjacent with respect to one another.

5. System according to claim 3, wherein said control means includes means to designate a specific connection module connected to said test bench complementing each of said intermediate connection means.

6. System according to claim 3, wherein said storage means comprise at least one support for a plurality of connection modules complementing the intermediate connection device, said modules being aligned adjacent with respect to one another.

7. System according to claim 6, wherein said means for searching for and indicating a particular intermediate connection device are mounted on a carriage movable along said support.

8. System according to claim 7, wherein said carriage is disposed on an endless strip driven by a step motor.

9. System according to claim 3, wherein the identification means of the intermediate connection devices comprise a pair of resistors with specific values and are mounted in the second connector of each of said intermediate connection devices, and wherein the search and indicating means comprise means for measuring the values of the resistors of said pairs.

10. System according to claim 5, wherein the means to designate the specific connection module of said intermediate connection device on the test bench includes a laser beam generator.

* * * * *